US008825442B1

(12) United States Patent
 Kirschenbaum

(10) Patent No.: US 8,825,442 B1
(45) Date of Patent: Sep. 2, 2014

(54) PROBABILISTIC SWITCHING DETERMINATION FOR ELECTRICAL DEVICES

(75) Inventor: Leif Stefan Kirschenbaum, Napa, CA (US)

(73) Assignee: Grandis Inc., Milpitas, CA (US)

( * ) Notice: Subject to any disclaimer, the term of this patent is extended or adjusted under 35 U.S.C. 154(b) by 1015 days.

(21) Appl. No.: 12/888,257

(22) Filed: Sep. 22, 2010

(51) Int. Cl.
 *G06F 17/18* (2006.01)
(52) U.S. Cl.
 USPC .......................................................... 702/181
(58) Field of Classification Search
 CPC ........................................................ H03H 2/00
 USPC .......................................................... 702/181
 See application file for complete search history.

(56) References Cited

U.S. PATENT DOCUMENTS 6,979,998 B2 * 12/2005 Sharma et al. ................ 324/252

* cited by examiner

*Primary Examiner* — Stephen Cherry
(74) *Attorney, Agent, or Firm* — Renaissance IP Law Group LLP

(57) ABSTRACT

A method for determining switching characteristics in electronic devices is disclosed. The method includes applying a ramped series of electrical pulses, identifying a candidate switching pulse, grouping the measured parameter values for the remaining electrical pulses, extrapolating an expected parameter value for the candidate switching pulse for each group, and comparing the expected parameter value for each group to the parameter value for the candidate switching pulse. The method also includes applying a ramped series of electrical pulses, identifying a candidate switching pulse, and clustering the remaining measured parameter values.

14 Claims, 12 Drawing Sheets

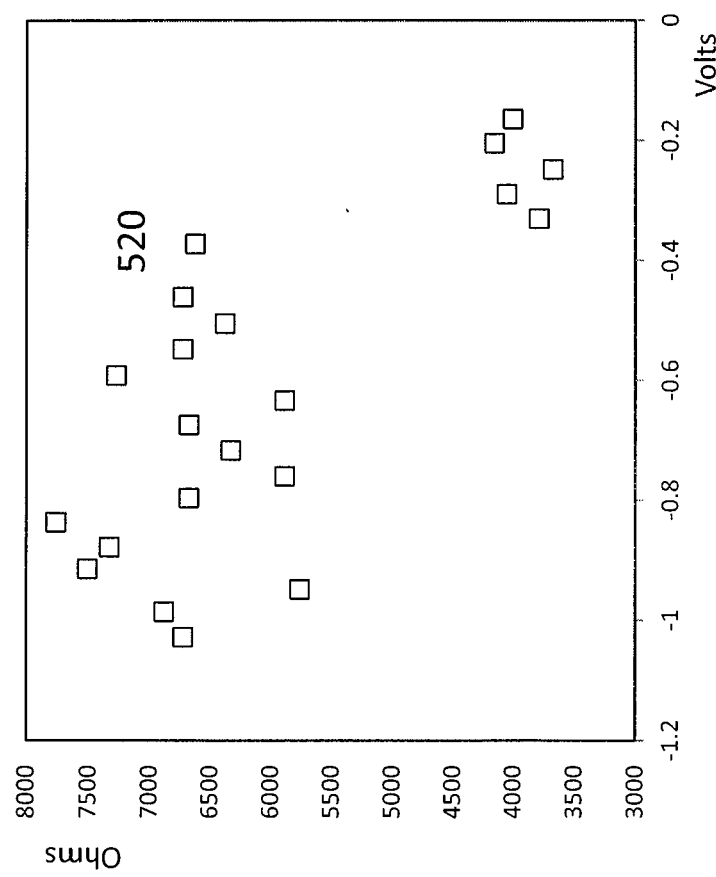

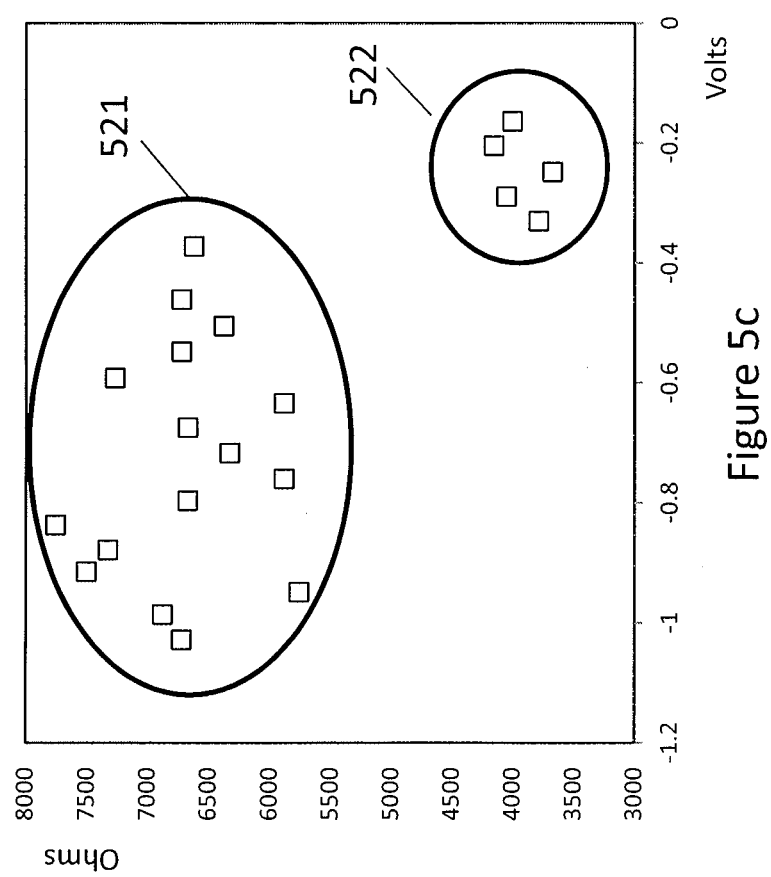

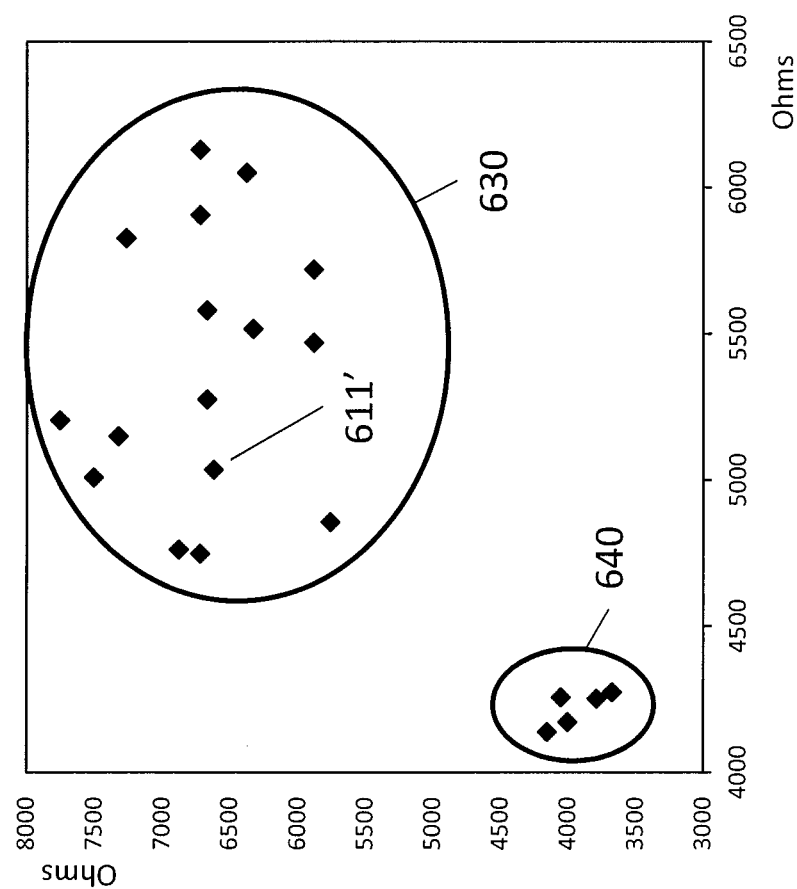

PROBABILISTIC SWITCHING DETERMINATION FOR ELECTRICAL DEVICES

GOVERNMENT RIGHTS

This invention was made with U.S. Government support under Grant/Contract No. HR0011-09-C-0023 awarded by DARPA. The U.S. Government retains certain rights in this invention.

BACKGROUND

This application relates to determining switching characteristics in electronic devices.

Various electronic devices operate between two states. For example, a two state magnetic memory device can be constructed from magnetic materials using multilayer structures which have at least one ferromagnetic layer configured as a "free" layer whose magnetic direction can be changed between two states by an external magnetic field or a control current. Magnetic memory devices may be constructed using such multilayer structures where information is stored based on the magnetic direction of the free layer.

One example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. When the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer.

The resistance to the electrical current across the MTJ structures varies with the relative direction of the magnetizations in the two ferromagnetic layers. When the magnetizations of the two ferromagnetic layers are parallel to each other, the resistance across the MTJ structures is at a minimum value RP. When the magnetizations of the two ferromagnetic layers are anti-parallel with each other, the resistance across the MTJ or SV is at a maximum value RAP. The magnitude of this effect is commonly characterized by the tunneling magnetoresistance (TMR) in MTJs defined as $(R_{AP}-R_P)/R_P$.

The MTJ can be placed in either the parallel or antiparallel resistance states through the application of a magnetic field to the device, or through the application of a current through the device via the spin transfer effect.

One technique used to measure switching characteristics in an electronic device, such as, for example a MTJ structure being switched via the spin transfer effect, is by application of a ramped series of electrical pulses. For example, as depicted in FIG. 1, the device under test (DUT) 110, e.g. the MTJ, might be placed in series with a known resistor 120. The application of a ramped series of electrical pulses might produce a voltage waveform 210 across the device under test as depicted in FIG. 2.

The state of the device may then be determined for the device at each pulse and after each pulse with the application of a low bias electrical pulse in order to determine the switching characteristics. FIG. 3 plots the resistance of a device, here a MTJ, against the ramped pulse voltage. In this example, the voltage pulses begin at −160 my and increase in amplitude. The resistance 310 is measured during the applied electrical pulses and the resistance 320 is measured after each electrical pulse with a low bias electrical pulse. The device switches from the low resistance state into the high resistance state at the application of a critical voltage, e.g., −370 my in this example. In addition, the resistance measured during the ramped electrical pulses decreases with increasing voltage magnitude due to the functional dependence of MTJ resistance on voltage. The noise in measured resistance is lower during the application of the ramped electrical pulse verses the low bias electrical pulse due to the larger input voltage.

SUMMARY

A probability and confidence interval that a switching pulse of a particular voltage changes the state of the device can be calculated. In addition, whether a switching pulse of a particular voltage is considered to change the state of the device can be determined using a clustering analysis.

In one aspect, a method for determining switching characteristics in an electrical device is provided, including applying a series of electrical pulses of different magnitude and measuring a value of an electrical parameter for each applied electrical pulse, identifying a first candidate switching pulse from the measured value of the electrical parameter for each applied electrical pulse, placing the measured value of the electrical parameter for each applied electrical pulse into one of two groups, wherein parameter values for electrical pulses having a magnitude less than the first candidate switching pulse are placed in a first group and parameter values for electrical pulses having a magnitude greater than the first candidate switching pulse are placed in a second group, calculating a first extrapolated parameter value corresponding to the first group for the first candidate switching pulse and a confidence interval for the first extrapolated parameter value, calculating a second extrapolated parameter value corresponding to the second group for the first candidate switching pulse and a confidence interval for second extrapolated parameter value and comparing the measured parameter value at the candidate switching pulse to the first and second extrapolated parameter values to determine a relative probability that the first candidate switching pulse caused the switching event.

In a second aspect, a method for determining switching characteristics in an electrical device is provided, including applying a series of electrical pulses of different magnitude and measuring a value of an electrical parameter for each applied electrical pulse, identifying a candidate switching pulse from the measured value of the electrical parameter for each applied electrical pulse, clustering the measured parameter values into two groups, wherein the parameter values for electrical pulses having a magnitude less than the candidate switching pulse are placed in a first cluster and the parameter values for electrical pulses having a magnitude greater than the candidate switching pulse are placed in a second cluster, and identifying whether the candidate switching pulse caused the electrical device to switch based on which cluster it is placed.

In a third aspect, a method for determining switching characteristics in an electrical device is provided, including applying a series of electrical pulses of different magnitude and measuring values of N electrical parameters for each applied electrical pulse where N is at least two, identifying a candidate switching pulse from the measured electrical parameter values for each applied electrical pulse, clustering the groups of N measured parameter values into two groups, and identifying whether the candidate switching pulse caused the electrical device to switch based on which cluster it is placed.

The above techniques may have the advantage of determination of more accurate switching characteristics. The determination of more accurate switching characteristics may have the advantage of determining the proper operating range for electrical devices, which may have the advantage of lower error rates and better data retention time for some devices.

These and other implementations are described in greater detail in the drawings, the description and the claims.

BRIEF DESCRIPTION OF THE DRAWINGS

FIG. 5b depicts the resistance of a device under test with the application of a ramped series of electrical pulses, where the determination of which electrical pulse causes a device to switch is not clear.

FIG. 5c depicts the resistance of a device under test with the application of a ramped series of electrical pulses, where the measured parameter values are placed into two clusters.

FIG. 6c depicts the parameter value groupings of FIG. 6b, where the groupings have been placed into clusters.

DETAILED DESCRIPTION

Often, the determination of which electrical pulse causes a device under test to switch is not clear. For example, the device under test may switch during a voltage pulse, and thus the average voltage measured during the pulse does not correspond to one particular state. Then a plot of device resistance versus pulse voltage does not clearly determine which electrical pulse switched the device between states. The problem may be compounded by system noise or system resolution; short pulse widths require fast digitization rates which result in low analog to digital conversion resolution in most data acquisition systems. An analysis of the pulse itself might be suggested. But this may be computationally intensive and also suffer the same noise and resolution issue.

Figure 1:
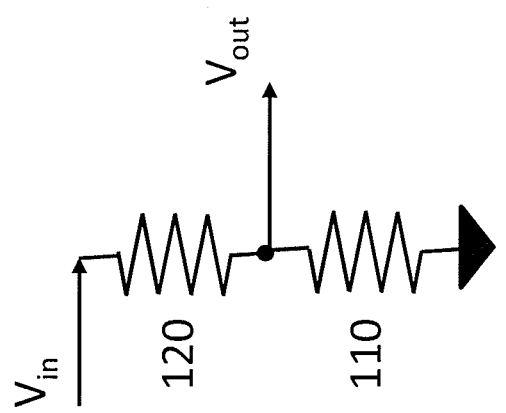
FIG. 1 shows the application of a test voltage $V_{in}$ to a device under test in series with a known resistor.
Figure 2:
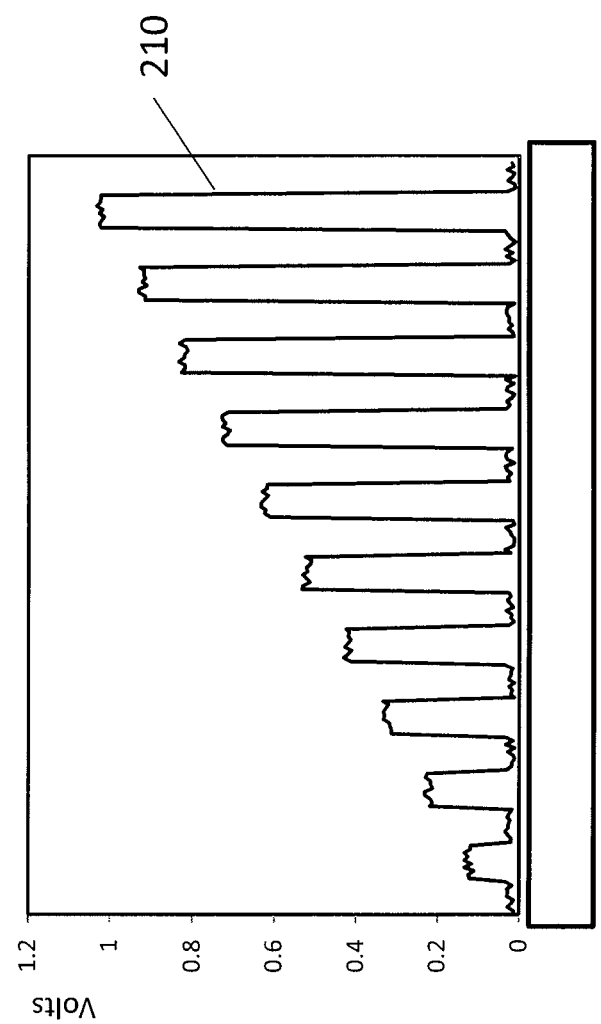
FIG. 2 shows a voltage waveform from a device under test with the application of a ramped series of electrical pulses.
Figure 3:
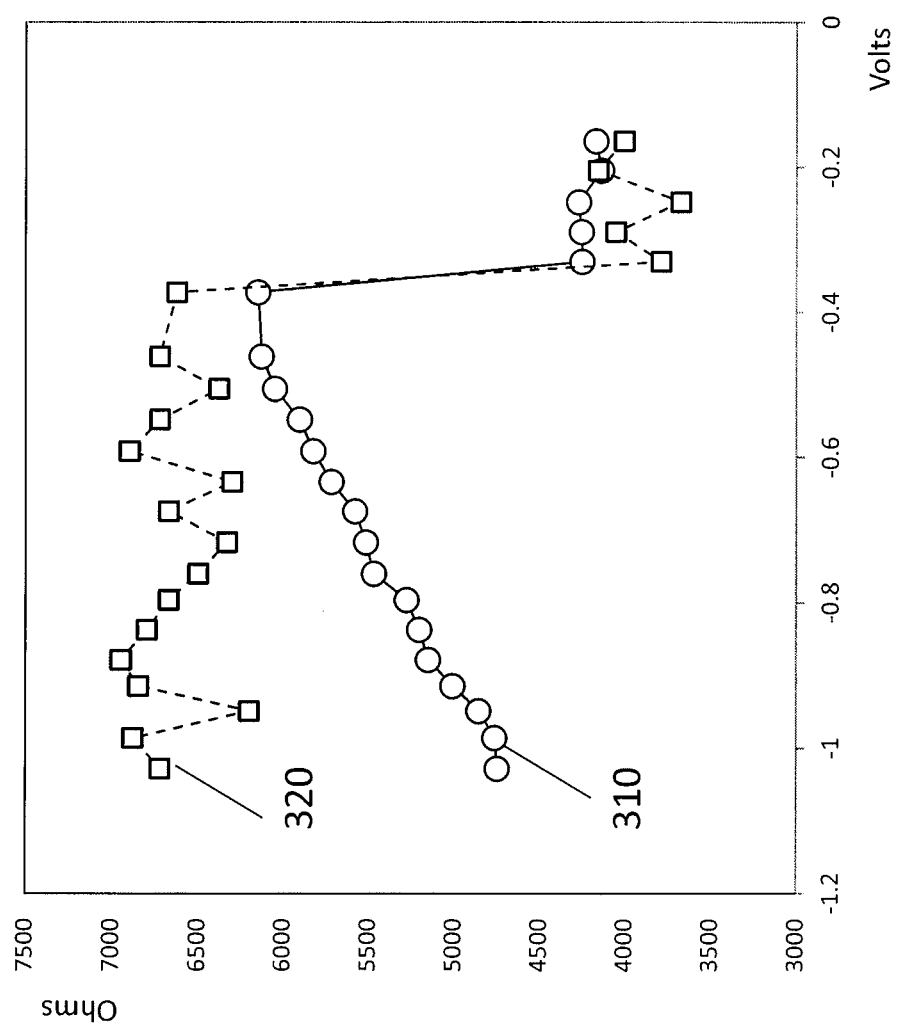
FIG. 3 is a graph that depicts the resistance of a device under test as a function of the voltage of an applied electrical pulse.
Figure 4A:
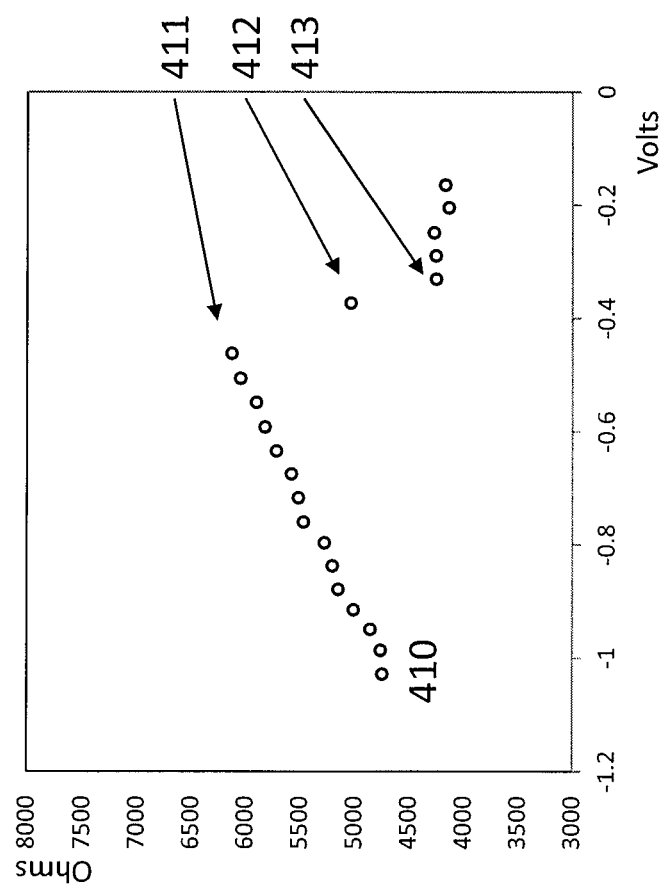
FIG. 4a depicts the resistance of a device under test with the application of a ramped series of electrical pulses, where the determination of which electrical pulse causes a device to switch is not clear.

In a first embodiment, FIG. 4a depicts the resistance versus pulse voltage for a device under test where the determination of which electrical pulse causes a device to switch is not clear. FIG. 4 depicts a series of measurements 410 of the resistance as a function of pulse voltage, with the resistance measured during the ramped pulse, where the amplitude of the ramped series of electrical pulses increase from low to high negative voltage. Measurement point 411 shows the device in the high resistance state while point 413 shows the device in the low resistance state. The resistance measured during the voltage pulse at measurement point 412, the candidate switching pulse, makes it unclear whether that pulse caused the device to switch.

According to this first embodiment, the measured parameter value for a candidate switching pulse is compared to the group of measured parameter values in one state and to the group of measured parameter values in another state. Here, the measured parameter is resistance but in other types of electrical devices the measured parameter could be resistance, voltage, current, or other characteristics. Based on the comparison of the measured parameter value for the candidate switching pulse and two groups of measured parameter values, a probabilistic calculation is made as to membership in either group.

Figure 4B:
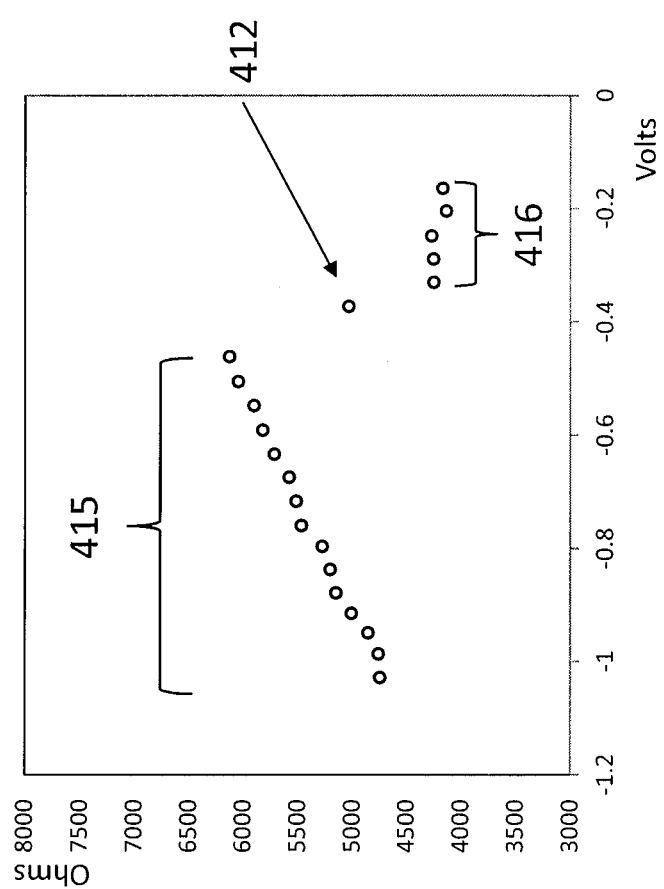
FIG. 4b depicts the resistance of a device under test where the measured parameter values, other than the candidate switching pulse, have been placed into two groups.

FIG. 4b depicts the parameter values of FIG. 4a assigned to two groups.

The electrical parameter values measured for each applied electrical pulse are divided into two groups. The measured parameter values before the candidate switching pulse are placed in a first group and the measured parameter values after the candidate switching pulse are place in a second group. The group of parameter values in the high resistance state is shown as 415 while the group of parameter values in the low resistance state is shown as 416.

Based on the comparison between the measured parameter value for the candidate switching pulse and the group of measured parameter values in the groups 415 and 416, a probabilistic calculation is made as to membership in either group.

Figure 4C:
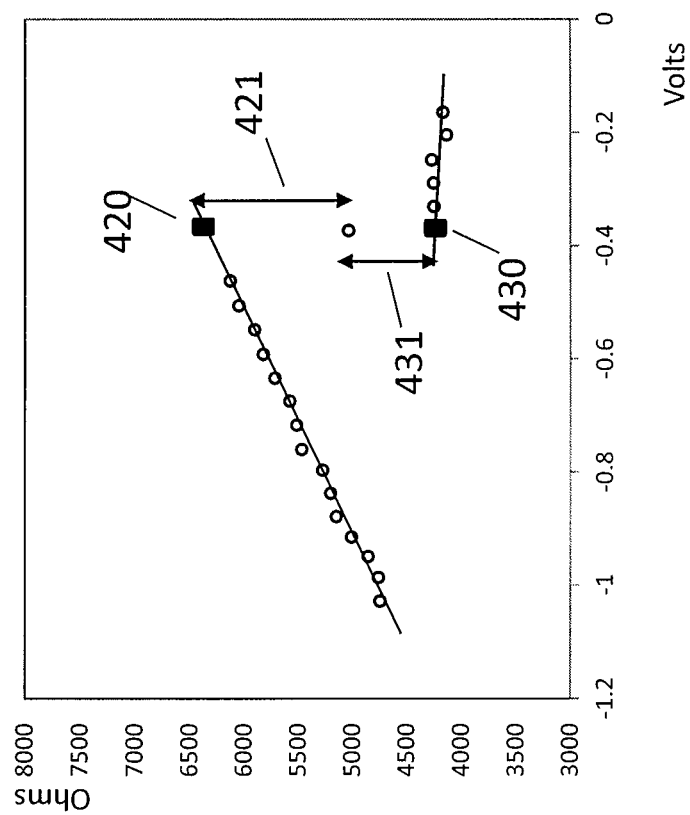
FIG. 4c depicts the resistance of a device under test where the extrapolated parameter values at the candidate switching pulse for the two groups is identified and compared with the measured parameter values at the candidate switching pulse.

First, as shown in FIG. 4c, a line may be fit to the existing data for each group, excluding the candidate switching pulse. An extrapolation may be made to the device voltage of the candidate switching pulse and the confidence interval around that point is calculated. The extrapolation may be made by a linear fit, polynomial fit, or other appropriate function. The extrapolated parameter value, here resistance, at the candidate switching pulse for the high resistance state is then calculated, 420, along with the confidence interval for the extrapolated resistance (not shown). Also, the extrapolated resistance at the candidate switching pulse for the low resistance state is then calculated, 430, along with the confidence interval for the extrapolated resistance (not shown).

A comparison is made between the measured resistance at the candidate switching pulse and the extrapolated resistances in the high and low resistance state. A z-score may be calculated by taking the difference between the actual measured parameter value at the candidate switching pulse and the two extracted values, 421 and 431, and then normalizing using a confidence-interval of the extrapolated value, spread in the group, error, or other statistic for each group or the groups together, to determine relative probabilities of each groups' predicted extrapolated value.

Two different candidate pulses may be compared by comparing the probabilities for each pulse, to determine which candidate pulse causes the switching event. For example, in comparing two points A and B, a comparison is made between the Probability (A switched) and Probability (B did not switch) versus Probability (A did not switch) and Probability (B switched).

Figure 5A:
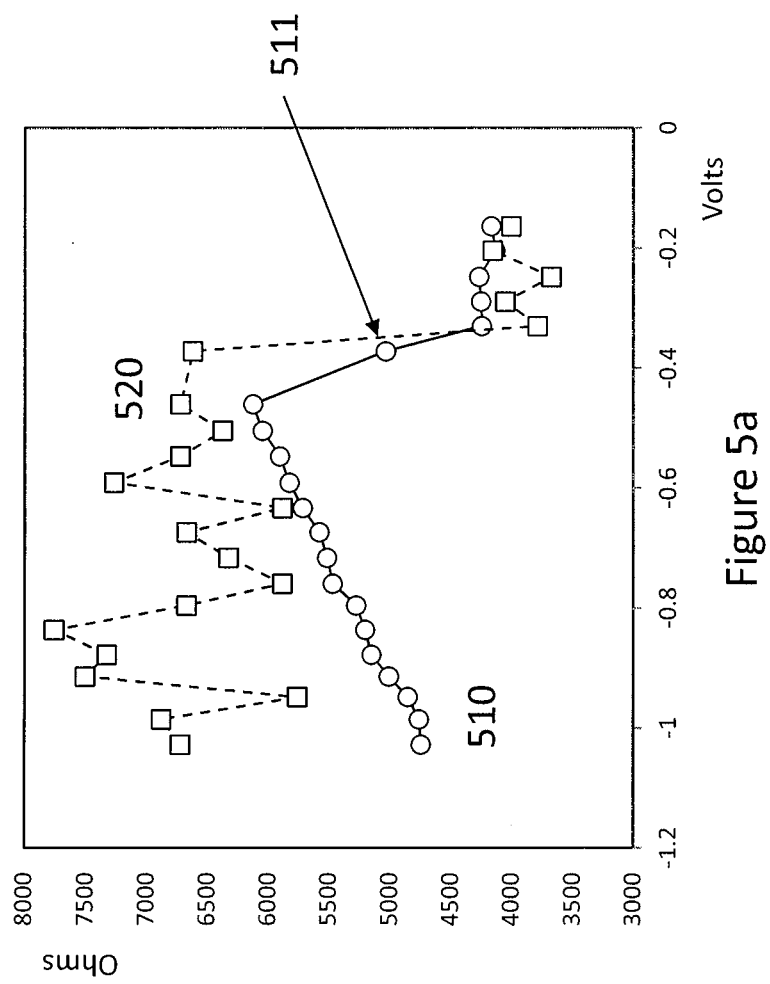
FIG. 5a depicts the resistance of a device under test with the application of a ramped series of electrical pulses, where the determination of which electrical pulse causes a device to switch is not clear.

In a second embodiment, FIG. 5a depicts the resistance versus pulse voltage for a device under test where the determination of which electrical pulse causes a device under test to switch is not clear. FIG. 5a depicts a series of measurements 510 of the resistance as a function of pulse voltage, with the resistance measured during the ramped pulse, where the pulse increases from low to high negative voltage. The resistance measured during the voltage pulse at measurement point 511, the candidate switching pulse, makes it unclear whether that pulse caused the device to switch. FIG. 5a also depicts a series of measurements 520 of the resistance as a function of pulse voltage, with the resistance measured after the ramped pulse is turned off and during a low bias electrical pulse.

In this embodiment, a parameter value for switching pulses are clustered into two (or more) groups using k-means clustering, hierarchical clustering, another appropriate clustering algorithm, or an expectation-maximization algorithm. The parameter value for the candidate switching pulse is evaluated for probability of membership in the various groups.

For example, the device resistances, as measured by a post-candidate pulse low-bias resistance measurement, are grouped into two groups using k-means clustering. FIG. 5b depicts device resistances 520, as measured by a post pulse low-bias resistance measurement. FIG. 5c depicts device resistances 520, where the parameter values have been placed into two clusters, 521 and 522. Here, the candidate switching pulse is clustered into the high resistance state cluster, indicating that it is the switching pulse that causes the switching between the low and high resistance state.

Figure 6A:
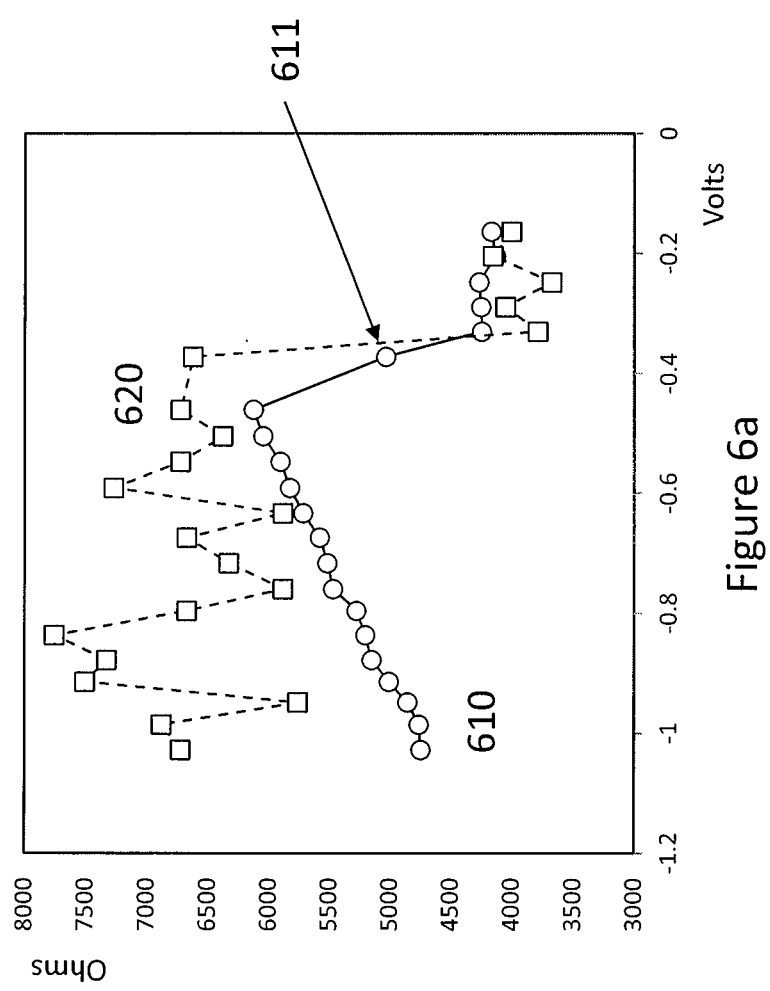
FIG. 6a depicts the resistance of a device under test with the application of a ramped series of electrical pulses, where the determination of which electrical pulse causes a device to switch is not clear.

In a third embodiment, FIG. 6a depicts the resistance versus pulse voltage for a device under test where the determination of which electrical pulse causes a device under test to switch is not clear. FIG. 6a depicts a series of measurements 610 of the resistance as a function of pulse voltage, with the resistance measured during the ramped pulse. The resistance measured during the voltage pulse at measurement point 611, the candidate switching pulse, makes it unclear whether that pulse caused the device to switch. FIG. 6a also depicts a series of measurements 620 of the resistance as a function of pulse voltage, with the resistance measured after the ramped pulse is turned off and during a low bias electrical pulse.

In this embodiment two (N=2) or more parameter values are utilized in N-dimensional space to perform k-means, hierarchical clustering, or other clustering. Then the switching pulse's parameter values are used to calculate a probability of membership in each of the k groups. An example would be to use both the device resistance as calculated from the applied switching pulse voltage and the device resistance as calculated from a post-pulse low-bias resistance measurement.

Figure 6B:
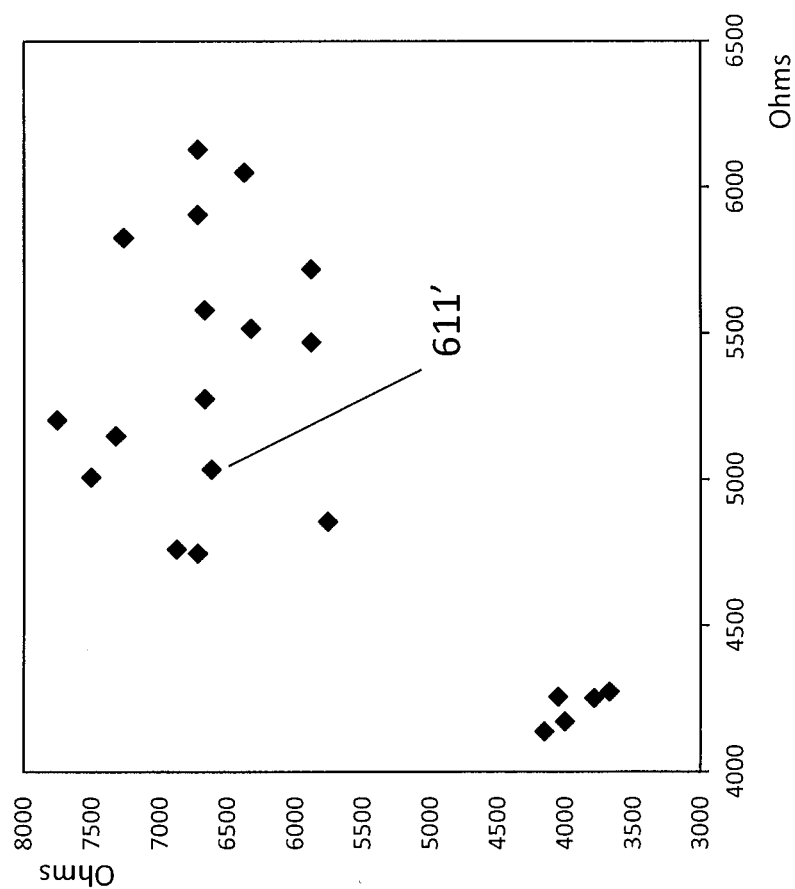
FIG. 6b depicts the resistance of a device under test with the application of a ramped series of electrical pulses, measured during the application of the ramped series of electrical pulses plotted against the resistance of a device under test with the application of a ramped series of electrical pulses, measured after the application of the ramped series of electrical pulses with a low bias resistance measurement.

FIG. 6b depicts the resistance 610 of the device in FIG. 6a, the resistance measure during the ramped electrical pulse, $R[V_{dev}]$ plotted against the resistance 620 of the device in FIG. 6a, the resistance measured during a low bias electrical pulse, $R[V_{read}]$. The point 611' is the point corresponding to the candidate switching pulse.

FIG. 6c depicts the resistance 610 of the device in FIG. 6a, the resistance measure during the ramped electrical pulse, $R[V_{dev}]$ plotted against the resistance 620 of the device in FIG. 6a, the resistance measured during a low bias electrical pulse, $R[V_{read}]$, where the parameter values $R[V_{dev}]$ v. $R[V_{read}]$ are placed into clusters 630 and 640, clusters corresponding high resistance and low resistance states respectively. As can be seen, the candidate switching pulse is placed in the high resistance state cluster, indicating the candidate switching pulse in fact caused the switching from low to high resistance.

While this patent application contains many specifics, these should not be construed as limitations on the scope of an invention or of what may be claimed, but rather as descriptions of features specific to particular embodiments of the invention. Certain features that are described in this patent application in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations and enhancements of the described implementations and other implementations can be made based on what is described and illustrated in this patent application.

What is claimed is:

1. A method for determining switching characteristics in an electrical device comprising:
    applying a series of electrical pulses of different magnitude and measuring a value of an electrical parameter for each applied electrical pulse;
    identifying a first candidate switching pulse from the measured value of the electrical parameter for each applied electrical pulse;
    placing the measured value of the electrical parameter for each applied electrical pulse into one of two groups, wherein parameter values for electrical pulses having a magnitude less than the first candidate switching pulse are placed in a first group and parameter values for electrical pulses having a magnitude greater than the first candidate switching pulse are placed in a second group;
    calculating a first extrapolated parameter value corresponding to the first group for the first candidate switching pulse and a confidence interval for the first extrapolated parameter value;
    calculating a second extrapolated parameter value corresponding to the second group for the first candidate switching pulse and a confidence interval for second extrapolated parameter value; and
    comparing the measured parameter value at the candidate switching pulse to the first and second extrapolated parameter values to determine a relative probability that the first candidate switching pulse caused the switching event.

2. The method of claim 1, wherein the extrapolation includes using a linear fit.

3. The method of claim 1, wherein the extrapolation includes using a polynomial fit.

4. The method of claim 1, wherein the measured electrical parameter is voltage.

5. The method of claim 1, wherein the measured electrical parameter is resistance.

6. The method of claim 1, wherein the comparison involves comparing a ratio of the difference between the parameter for the candidate switching pulse and the first extrapolated parameter divided by the confidence interval of the first extrapolated parameter to the ratio of the difference between the parameter for the candidate switching pulse and the second extrapolated parameter divided by the confidence interval of the second extrapolated parameter.

7. The method of claim 1, wherein the comparison involves comparing the ratio of the difference between the parameter for the candidate switching pulse and the first extrapolated parameter divided by the spread in the first group of parameters to the ratio of the difference between the parameter for the candidate switching pulse and the second extrapolated parameter divided by the spread in the second group of parameters.

8. The method of claim 1, further comprising:
   identifying a second candidate switching pulse from the measured value of the electrical parameter for each applied electrical pulse;
   placing the measured value of the electrical parameter for each applied electrical pulse into one of two groups, wherein parameter values for electrical pulses having a magnitude less than the second candidate switching pulse are placed in a third group and parameter values for electrical pulses having a magnitude greater than the second candidate switching pulse are placed in a fourth group;
   calculating a third extrapolated parameter value corresponding to the third group for the second candidate switching pulse and a confidence interval for the third extrapolated parameter value;
   calculating a fourth extrapolated parameter value corresponding to the fourth group for the second candidate switching pulse and a confidence interval for fourth extrapolated parameter value;
   comparing the measured parameter value at the second candidate switching pulse to the third and fourth extrapolated parameter to determine the relative probability that the second candidate switching pulse caused the switching event;
   comparing the relative probability that the first candidate switching pulse caused the switching event and the relative probability that the second candidate switching pulse did not cause the switching event with the relative probability that the second candidate switching pulse caused the switching event and the relative probability that the first candidate switching pulse did not cause the switching event to determine which pulse caused the switching event.

9. A method for determining switching characteristics in an electrical device comprising:
   applying a series of electrical pulses of different magnitude and measuring a value of an electrical parameter for each applied electrical pulse;
   identifying a candidate switching pulse from the measured value of the electrical parameter for each applied electrical pulse;
   clustering the measured parameter values into two groups, wherein the parameter values for electrical pulses having a magnitude less than the candidate switching pulse are placed in a first cluster and the parameter values for electrical pulses having a magnitude greater than the candidate switching pulse are placed in a second cluster; and
   identifying whether the candidate switching pulse caused the electrical device to switch based on which cluster it is placed.

10. The method of claim 9, wherein the clustering includes k-means clustering.

11. The method of claim 9, wherein the clustering includes hierarchical clustering.

12. A method for determining switching characteristics in an electrical device comprising:
   applying a series of electrical pulses of different magnitude and measuring values of N electrical parameters for each applied electrical pulse where N is at least two;
   identifying a candidate switching pulse from the measured electrical parameter values for each applied electrical pulse;
   clustering the groups of N measured parameter values into two groups; and
   identifying whether the candidate switching pulse caused the electrical device to switch based on which cluster it is placed.

13. The method of claim 12, wherein the clustering includes k-means clustering.

14. The method of claim 12, wherein the clustering includes hierarchical clustering.

* * * * *